(12) United States Patent
Carey

(10) Patent No.: US 7,738,217 B2
(45) Date of Patent: Jun. 15, 2010

(54) EMR MAGNETIC HEAD HAVING A MAGNETIC FLUX GUIDE AND A BODY FORMED AT A TAIL END OF A SLIDER

(75) Inventor: Matthew Joseph Carey, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1136 days.

(21) Appl. No.: 11/352,526

(22) Filed: Feb. 13, 2006

(65) Prior Publication Data

US 2007/0188933 A1 Aug. 16, 2007

(51) Int. Cl.
G11B 5/33 (2006.01)
G11B 5/127 (2006.01)
(52) U.S. Cl. .................. 360/313; 360/321; 257/421
(58) Field of Classification Search .......... 360/313, 360/321; 257/421
See application file for complete search history.

(56) References Cited

U.S. PATENT DOCUMENTS

| | | | |
|---|---|---|---|
| 4,291,351 A * | 9/1981 | Pennell et al. ............. | 360/321 |
| 5,508,868 A | 4/1996 | Cheng et al. | |
| 5,627,704 A | 5/1997 | Lederman et al. | |
| 5,666,248 A | 9/1997 | Gill | |
| 5,965,283 A | 10/1999 | Solin et al. | |
| 6,707,122 B1 | 3/2004 | Hines et al. | |
| 6,930,862 B2 * | 8/2005 | Gill et al. .................. | 360/313 |

(Continued)

FOREIGN PATENT DOCUMENTS

EP 0 818 038 B1 6/2003

(Continued)

OTHER PUBLICATIONS

T.Zhou, D.R. Hines, and S.A. Solin, Extraordianry Magnetoresistance in Esternally Shunted Van der Pauw Plates, vol. 78, No. 5, Jan. 29, 2001.

(Continued)

*Primary Examiner*—Brian E Miller
(74) *Attorney, Agent, or Firm*—John J. Oskorep, Esq.; Rambod Nader

(57) ABSTRACT

A magnetic head of the present application has a sensor which employs the extraordinary magnetoresistance (EMR) effect. The magnetic head includes a body of semiconductor material positioned over a tail end of a carrying mechanism; a field receiving surface of the body oriented perpendicular to a sensing plane of the magnetic head; an electrically conducting shunt coupled to a first end of the body; a plurality of electrically conducting contacts coupled to a second end of the body opposite the first end; and a magnetic flux guide having a first end at least partially formed over the field receiving surface and a second end exposed at the sensing plane. Advantageously, the magnetic flux guide orients a signal field of recorded data from a magnetic medium in a suitable direction for the field receiving surface, at least partially shields the field receiving surface magnetically, and allows for positioning of the magnetic head on the tail end of the carrying mechanism. Preferably, the slider over which the body is formed is made from a material of similar crystal structure, but higher electrical resistance, as the material of the body. In this way, the body may be grown epitaxially from the slider and be integrally formed therewith.

20 Claims, 4 Drawing Sheets

U.S. PATENT DOCUMENTS

| | | | |
|---|---|---|---|
| 7,084,624 B2 * | 8/2006 | Tokura et al. | 324/244.1 |
| 7,167,346 B2 * | 1/2007 | Carey et al. | 360/313 |
| 7,203,036 B2 * | 4/2007 | Chattopadhyay et al. | 360/313 |
| 7,295,406 B2 * | 11/2007 | Chattopadhyay et al. | 360/313 |
| 7,466,521 B2 * | 12/2008 | Boone et al. | 360/313 |
| 7,502,206 B2 * | 3/2009 | Gurney et al. | 360/313 |
| 7,508,635 B2 * | 3/2009 | Boone et al. | 360/313 |
| 7,633,718 B2 * | 12/2009 | Fontana et al. | 360/245.8 |
| 2002/0167766 A1 | 11/2002 | Hayashi | |
| 2003/0123198 A1 | 7/2003 | Sugawara et al. | |
| 2003/0128478 A1 | 7/2003 | Gill et al. | |
| 2003/0235015 A1 | 12/2003 | Wu | |
| 2004/0071017 A1 | 4/2004 | Seigler et al. | |
| 2004/0218309 A1 * | 11/2004 | Seigler | 360/313 |

FOREIGN PATENT DOCUMENTS

| | | |
|---|---|---|
| EP | 1619514 A2 | 1/2006 |

OTHER PUBLICATIONS

Tineke Thio and S.A. Solin, Giant Magnetroesistence Enhancement in INhomogeneous Semiconductors, vol. 72, No. 26, Jun. 29, 1998.

Chinese Office Action for Chinese Patent Application # 200710005774.3—Nov. 21, 2008.

* cited by examiner

EMR MAGNETIC HEAD HAVING A MAGNETIC FLUX GUIDE AND A BODY FORMED AT A TAIL END OF A SLIDER

BACKGROUND

1. Field of the Technology

This invention relates generally to magnetic heads of magnetic storage devices such as disk drives, and more particularly to magnetic heads having extraordinary magnetoresistance (EMR) sensors.

2. Description of the Related Art

Magnetoresistive (MR) sensors have typically been used as read sensors in hard disk drives. An MR sensor detects magnetic field signals through the resistance changes of a read element, fabricated of a magnetic material, as a function of the strength and direction of magnetic flux being sensed by the read element. The conventional MR sensor, such as that used as a MR read head for reading data in magnetic recording disk drives, operates on the basis of the anisotropic magnetoresistive (AMR) effect of the bulk magnetic material, which is typically permalloy. A component of the read element resistance varies as the square of the cosine of the angle between the magnetization direction in the read element and the direction of sense current through the read element. Recorded data can be read from a magnetic medium, such as the disk in a disk drive, because the external field from the recorded magnetic medium (the signal field) causes a change in the direction of magnetization in the read element, which causes a change in resistance of the read element and a resulting change in the sensed current or voltage. Other types of sensors, such as GMR sensors and tunnel valve sensors, also utilize magnetic materials for operation.

Today's sensors are becoming very small, with trackwidths (TWs) approaching between about 50-200 nanometers (nm). With increasing areal densities and advancements in electron beam (e-beam) lithography, the trackwidth may shrink even below 50 nm. Given such reduced sizes, conventional sensors increasingly suffer from magnetic noise. In particular, the volume of a free layer of the sensor needs to be reduced in accordance with the trackwidth. However, a reduced volume makes the free layer magnetization more susceptible to thermal agitation, which leads to magnetic noise. Therefore, a sensor made from non-magnetic materials may be desirable for detecting small magnetic excitations such as those found in an ultrahigh-density disk drive.

A recently recognized type of semiconductor material exhibits extraordinary magnetoresistance (EMR). While such semiconductor material has been recognized as a candidate for use in storage technology, there have been minimal advancements in actual implementations of such application. The different characteristics exhibited by the EMR material with respect to traditional materials used with MR magnetic heads represent one reason for this lack of advancement. In particular, the MR magnetic heads can not simply be substituted with EMR magnetic heads. EMR magnetic heads require the signal field to be perpendicular to a field receiving surface of the magnetic head to achieve the EMR effect.

Accordingly, there is a need to solve this implementation issue so that EMR magnetic heads may be suitable for use in magnetic recording disk drives or any other desired storage technology context.

SUMMARY

A magnetic head of the present application has a sensor which employs the extraordinary magnetoresistance (EMR) effect. The magnetic head includes a body of semiconductor material positioned over a tail end of a carrying mechanism; a field receiving surface of the body oriented perpendicular to a sensing plane of the magnetic head; an electrically conducting shunt coupled to a first end of the body; a plurality of electrically conducting contacts coupled to a second end of the body opposite the first end; and a magnetic flux guide having a first end at least partially formed over the field receiving surface and a second end exposed at the sensing plane. Advantageously, the magnetic flux guide orients a signal field of recorded data from a magnetic medium in a suitable direction for the field receiving surface, at least partially shields the field receiving surface magnetically, and allows for positioning of the magnetic head on the tail end of the carrying mechanism. Preferably, the slider over which the body is formed is made from a material of similar crystal structure, but higher electrical resistance, as the material of the body. In this way, the body may be grown epitaxially from the slider and be integrally formed therewith.

BRIEF DESCRIPTION OF THE DRAWINGS

Other objects and advantages of the invention will become more apparent to those skilled in the art after considering the following detailed description in connection with the accompanying drawings.

DETAILED DESCRIPTION OF THE PREFERRED EMBODIMENTS

A magnetic head of the present application has a sensor which employs the extraordinary magnetoresistance (EMR) effect. The magnetic head includes a body of semiconductor material positioned over a tail end of a carrying mechanism; a field receiving surface of the body oriented perpendicular to a sensing plane of the magnetic head; an electrically conducting shunt coupled to a first end of the body; a plurality of electrically conducting contacts coupled to a second end of the body opposite the first end; and a magnetic flux guide having a first end at least partially formed over the field receiving surface and a second end exposed at the sensing plane. Advantageously, the magnetic flux guide orients a signal field of recorded data from a magnetic medium in a suitable direction for the field receiving surface, at least partially shields the field receiving surface magnetically, and allows for positioning of the magnetic head on the tail end of the carrying mechanism. Preferably, the slider over which the body is formed is made from the same high-mobility semiconductor material as the body, so that the body may be grown epitaxially from the slider and be integrally formed therewith.

The following description is the best embodiment presently contemplated for carrying out the present invention. This description is made for the purpose of illustrating the general principles of the present invention and is not meant to limit the inventive concepts claimed herein.

Figure 1:
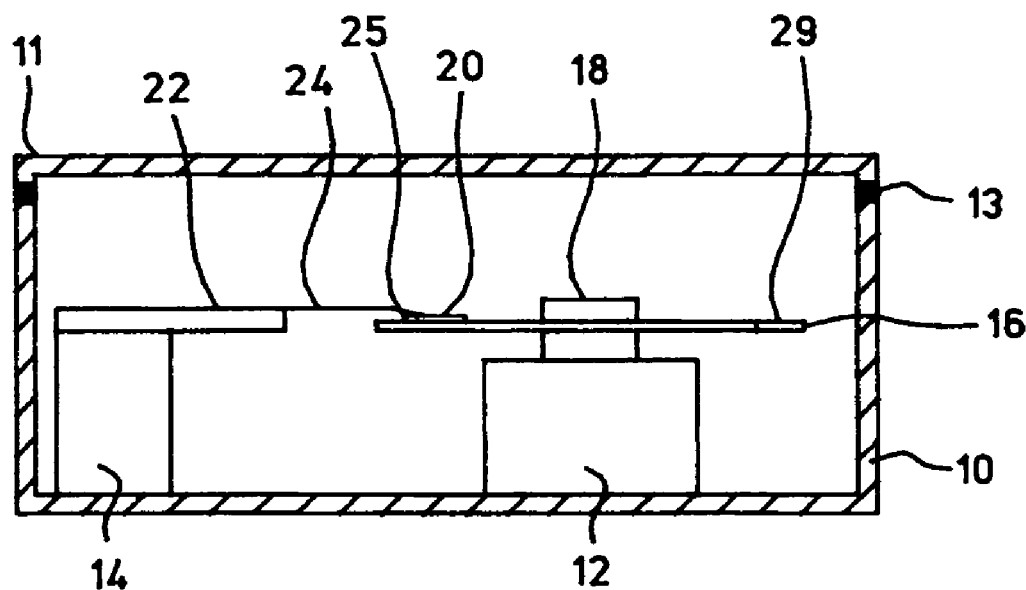
FIG. 1 is a cross-sectional view of a disk drive which may embody an extraordinary magnetoresistance (EMR) magnetic head.
Figure 2:
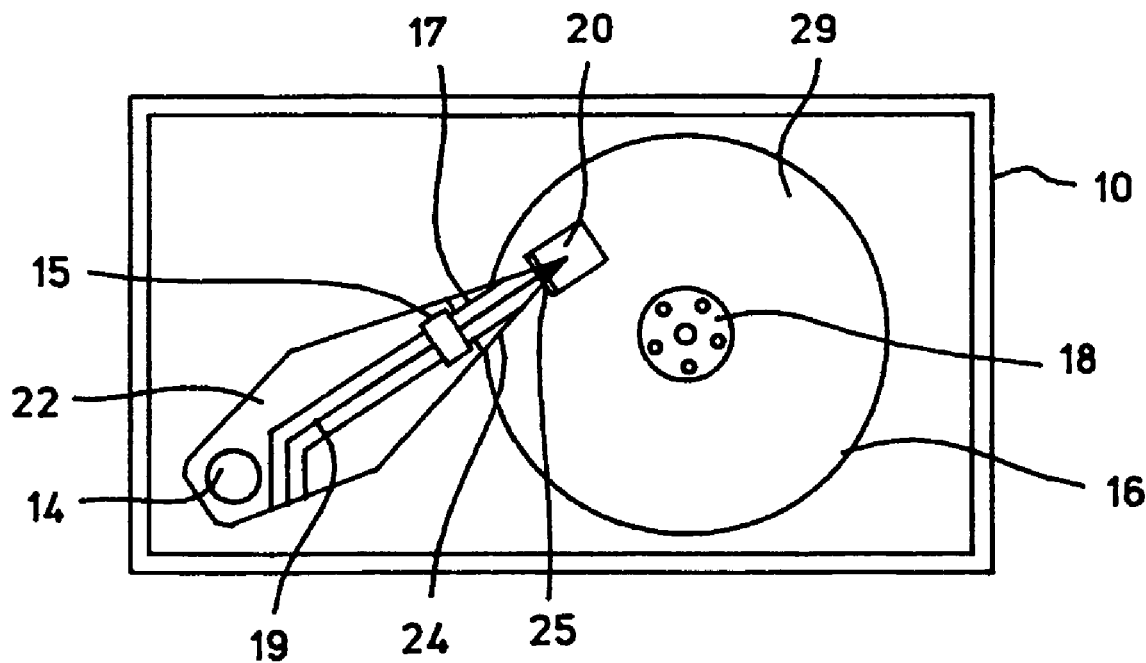
FIG. 2 is a top-down view of the disk drive of FIG. 1.

FIG. 1 is a simplified block diagram of a conventional magnetic recording disk drive having a magnetic head which includes a Hall effect sensor. FIG. 2 is a top view of the disk drive of FIG. 1 with the cover removed. Referring first to FIG. 1, there is illustrated in a sectional view a schematic of the disk drive. The disk drive comprises a base 10 to which are secured a disk drive motor 12 and an actuator 14, and a cover 11. Base 10 and cover 11 provide a substantially sealed housing for the disk drive. Typically, there is a gasket 13 located between base 10 and cover 11 and a small breather port (not shown) for equalizing pressure between the interior of the disk drive and the outside environment. A magnetic recording disk 16, which is one type of magnetic recording media, is connected to drive motor 12 by means of a hub 18 to which it is attached for rotation by drive motor 12. A thin lubricant film 50 is maintained on the surface of disk 16. A read/write head or transducer 25 is formed on the trailing end of a carrier, such as an air-bearing slider 20. Transducer 25 is a read/write head comprising an inductive write head portion and a read head portion. Slider 20 is connected to actuator 14 by means of a rigid arm 22 and a suspension 24. Suspension 24 provides a biasing force which urges slider 20 onto the surface of the recording disk 16. During operation of the disk drive, drive motor 12 rotates disk 16 at a constant speed, and actuator 14, which is typically a linear or rotary voice coil motor (VCM), moves slider 20 generally radially across the surface of disk 16 so that read/write head 25 may access different data tracks on disk 16.

FIG. 2 illustrates in better detail suspension 24 which provides a force to slider 20 so as to position on disk 16. Suspension 24 may be a conventional type of suspension, such as the well-known Watrous suspension. This type of suspension also provides a gimbaled attachment of the slider which allows the slider to pitch and roll as it rides on the air bearing surface. The data detected from disk 16 by transducer 25 is processed into a data readback signal by signal amplification and processing circuitry in an integrated circuit chip 15 located on arm 22. The signals from transducer 25 travel via a flex cable 17 to chip 15, which sends its output signals to the disk drive electronics (not shown) via cable 19.

Figure 3A:
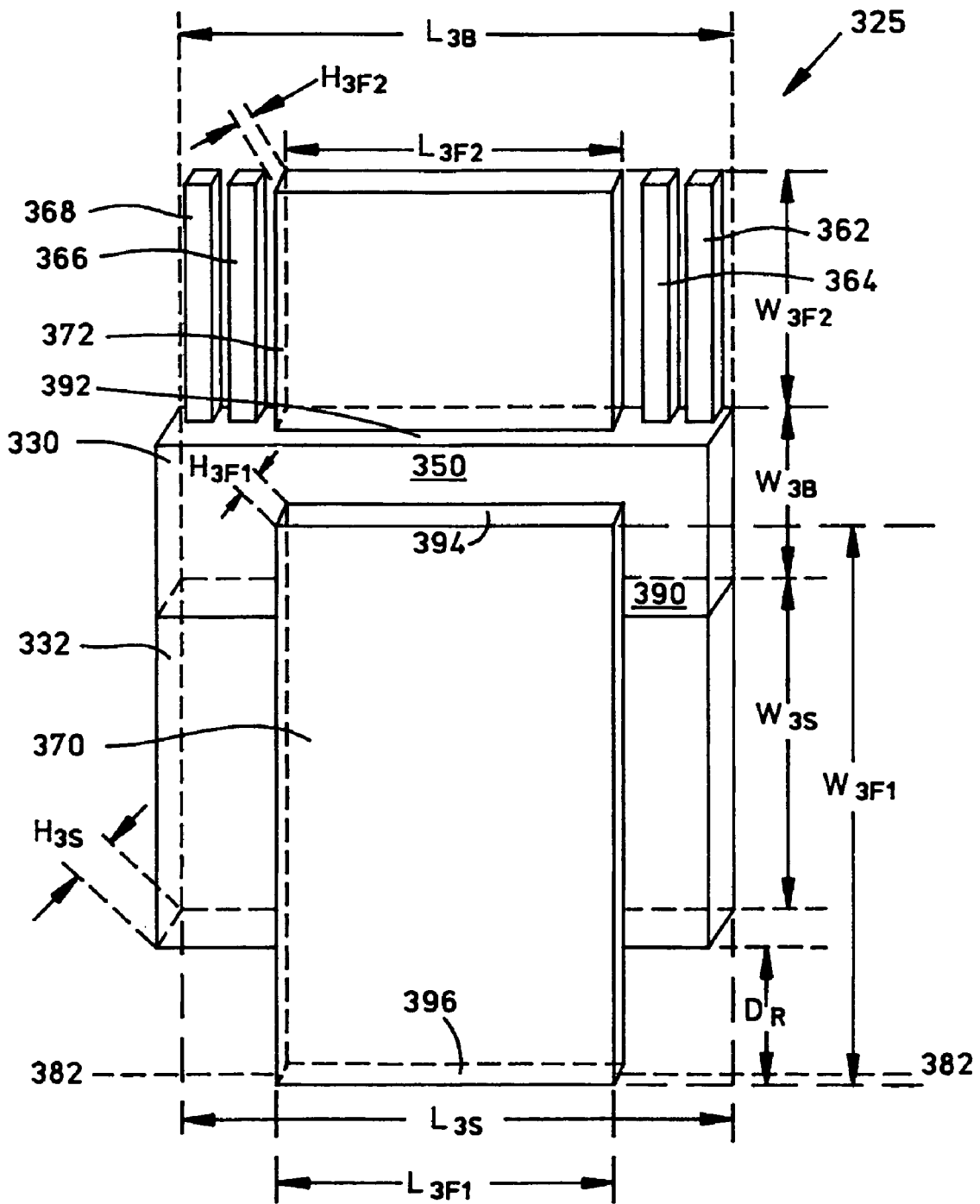
FIG. 3A is an elevational view of an EMR magnetic head having a body of semiconductor material, an electrically conducting shunt, a plurality of electrically conducting contacts, and a flux guide.

FIG. 3A is an elevational view of a representative EMR magnetic head 325 with a flux guide of the present application. EMR magnetic head 325 is utilized as the magnetic head in the disk drive shown and described in relation to FIGS. 1 and 2. In particular, EMR magnetic head 325 is formed on a tail end of slider 20 of FIG. 1. As shown in FIG. 3A, EMR magnetic head 325 includes a body of EMR semiconductor material 330, an electrically conducting shunt 332, a plurality of electrically conducting contacts 362, 364, 366, and 368, and a magnetic flux guide which includes two flux guide structures 370 and 372.

In general, body 330 is made of a semiconductor quantum-well heterostructure with high electron mobility. These narrow band-gap semiconductors exhibit room temperature magnetoresistance (MR) at orders of magnitude larger than that obtained from conventional read sensor materials. In this exemplary embodiment, body 330 is made at least partly of Indium Antimonide (InSb). However, body 330 may be made from any suitable EMR material(s). Preferably, body 330 is a multi-layered structure having an energetic potential well (quantum well) created by the various semiconducting material layers due to the different band-gaps of the different materials. Typical narrow band-gap materials are InSb and Indium Arsenide (InAs). The room temperature electron mobility of InSb and InAs are ~70,000 cm$^2$/Vs and ~35,000 cm$^2$/Vs, respectively. As shown in FIG. 3A, body 330 is a rectangular planar body. However, other suitable shapes may be utilized for body 330. Body 330 has a length $L_{3B}$, a width $W_{3B}$, and a height $H_{3B}$. In the present embodiment, these dimensions correspond to about 100 nm by 50 nm by 20 nm, respectively. More generally, body 330 may have dimension ranging from 10-1000 nm by 10-1000 nm by 10-1000 nm.

Preferably, the slider over which body 330 is formed is made from a material of the same or similar crystal structure, but higher electrical resistance, as the material of body 330. Preferably, this material is or includes gallium arsenide (GaAs). Thus, there is a lattice match between the slider and body 330 so that body 330 may be grown epitaxially from the slider. In this case, body 330 is integrally formed with the slider.

Electrically conducting shunt 332 is preferably an ohmic contact to body 330, formed over a first end 390 of body 330. Providing shunt 332 adjacent body 330 engenders even larger room-temperature MRs than that of body 330 alone. Gold (Au) and Au alloys, preferably a gold germanium (AuGe) or gold tin (AuSn) alloy, are the most common and preferred materials for ohmic contact fabrication on semiconductor quantum-well heterostructure materials. In this exemplary embodiment, shunt 330 is made of Au; however, shunt 332 may be made of any suitable electrically conducting material. A typical contact resistance area product for an ohmic contact is in the range of 1E-7 to 1E-6 Ohm·cm$^2$. Note that shunt 332 shields body 330 at first end 390.

As shown in FIG. 3A, shunt 332 is a rectangular planar body although other suitable shapes may be utilized. As indicated in FIG. 3A, shunt 332 has a length $L_{3S}$, a width $W_{3S}$, and a height $H_{3S}$. In the present embodiment, these dimensions correspond to about 50 nm by 75 nm by 20 nm, respectively. More generally, shunt 332 may have dimension ranges of 10-200 nm by 20-2000 nm by 5-500 nm. In FIG. 3A, $L_{3S}$ of shunt 332 is equivalent to $L_{3B}$ of body 330, but alternatively this may not be the case. Furthermore, body 330 and shunt 332 may be different shapes all together. Shunt 332 may be made using conventional processes, such as photolithography, electron beam (e-beam) lithography, thermal evaporation, sputtering, or other common thin film techniques known in the semiconductor industry.

Electrically conducting contacts 362, 364, 366, and 368 are formed over and make contact with second end 392 of body 330. As shown in FIG. 3A, these contacts include a pair of current contacts 362 and 368 and a pair of voltage contacts 364 and 366 (IVVI). Alternatively, the leads could be configured as current contacts 362 and 364 and voltage contacts 368 and 366 (IVIV). The number and positioning of the contacts may vary per the design requirements. The contacts are preferably made of metallic material. In-based semiconductors, for example, gold (Au) or alloys such as AuGe or AuSn, provide an ohmic or low Schottky barrier contact between the lead material and the semiconductor. However, the contacts may be made from any suitable electrically conducting material. The contacts are preferably rectangular planar bodies with dimensions 10 nm by 100 nm by 10 nm, respectively. More generally, the contacts may have dimension ranges of 5-50 nm by 50-1000 nm by 5-50 nm. The contacts may be formed using conventional lithographic patterning techniques.

As described above, the magnetic flux guide includes flux guide structures 370 and 372. Flux guide structure 370 has a first end 394 at least partially formed over field receiving surface 350 and a second end 396 exposed at a sensing plane 382. On the other hand, flux guide structure 372 is coupled to second end 392 of body 330. Flux guide structure 372 is flanked by electrically conducting contacts 362 and 364 on the right, and electrically conducting contacts 366 and 368 on the left. Flux guide structures 370 and 372 may be formed in direct contact with body 330. Alternatively, an intervening layer such as a diffusion or an insulating barrier layer may be formed between body 330 and flux guide structures 370 and 372.

Flux guide structure 370 is generally a rectangular planar body. However, other suitable shapes may be utilized. As indicated in FIG. 3A, flux guide structure 370 has a length $L_{3F1}$, a width $W_{3F1}$, and a height $H_{3F1}$. These dimensions may correspond to, for example, 50 nm by 100 nm by 5 nm, respectively. More generally, flux guide structure 370 may have dimension ranges of 10-200 nm by 20-2000 nm by 1-50 nm. Width $W_{3F1}$ is equal to or less than the trackwidth of a magnetic disk 316 (not shown). Flux guide structure 372 has a length $L_{3F2}$, a width $W_{3F2}$, and a height $H_{3F2}$. These dimensions may correspond to 50 nm by 100 nm by 5 nm, respectively. Alternatively, flux guide structure 372 may have dimension ranges of 10-200 nm by 20-2000 nm by 1-50 nm.

Flux guide structures 370 and 372 are preferably made from NiFe. However, flux guide structures 370 and 372 may be alternatively made from any suitable magnetically permeable material such as cobalt iron (CoFe). Since flux guide structure 370 is magnetic and has one end formed at a magnetic field sensing plane, it serves to capture magnetic field signals and direct them perpendicularly into field receiving surface 350 of body 330. On the other hand, flux guide structure 372 helps complete a low energy path for the magnetic field signals and increases overall efficiency of operation.

Figure 3B:
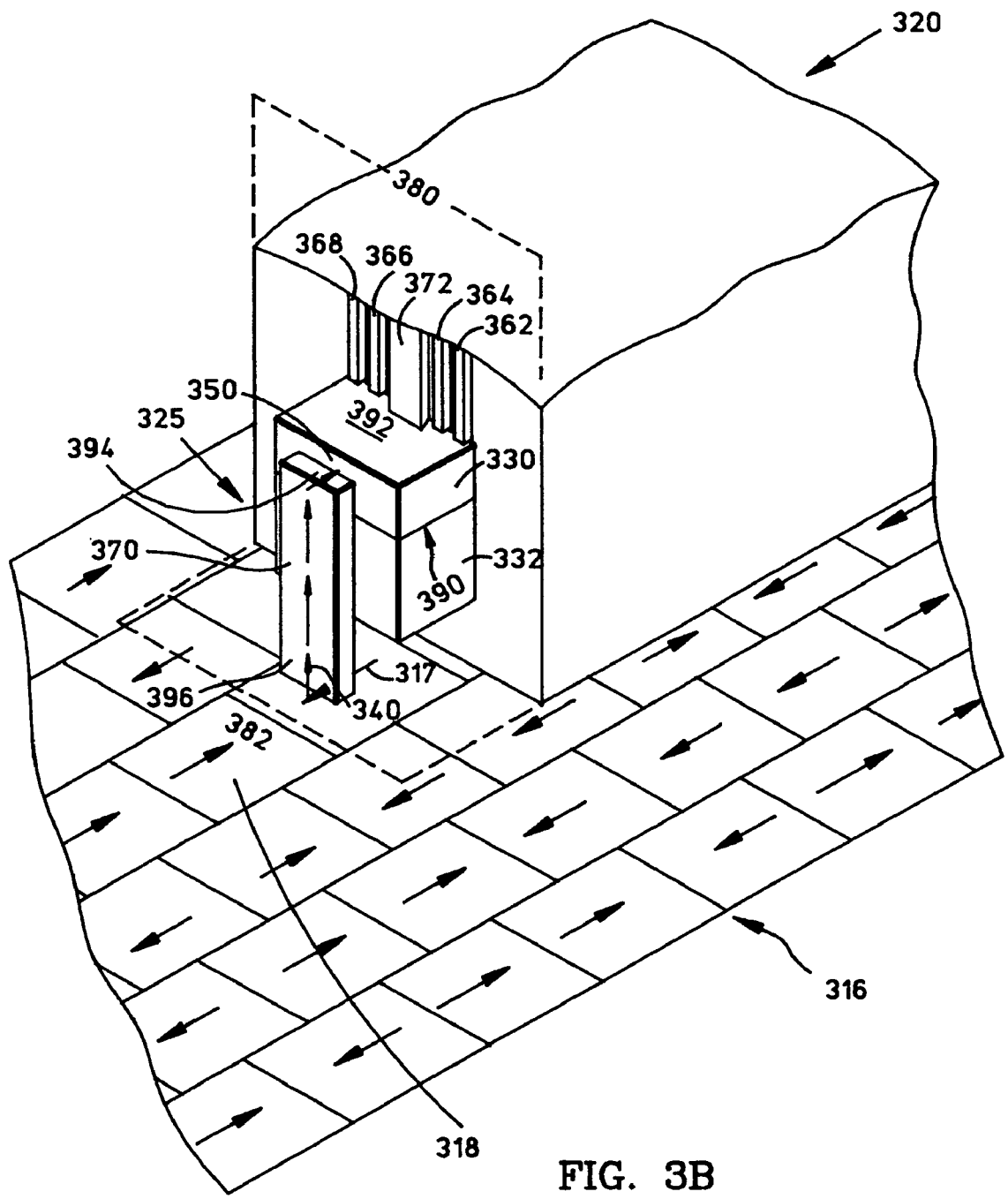
FIG. 3B is an illustration of the portion of a slider which carries the EMR magnetic head on its tail end with the field receiving surface of the body being perpendicular to the magnetic disk.

In FIG. 3B, an illustration of a tail end 380 of a carrying mechanism (e.g. a slider 320) of a disk drive which carries EMR magnetic head 325 is shown. In particular, EMR magnetic head 325 is carried on slider 320 such that it is exposed to magnetic field signals 340 from a magnetic disk 316. As discussed previously, body 330 requires magnetic field signals 340 from disk 316 be substantially normal to its field receiving surface 350, otherwise the device will not operate as intended. As shown, field receiving surface 350 is oriented substantially perpendicular to the plane of disk 316 and a sensing plane 382 (e.g. an air bearing surface or ABS).

Recorded bits on disk track 318 of magnetic disk 316 (such as a recorded bit 317) represent either a digital '0' or '1'. Magnetic field signals 340 originating from recorded bit 317 is brought to field receiving surface 350 of body 330 by flux guide structure 370. With low field signals 340, the resistance of body 330 increases so that more current flows through shunt 332 (i.e. the path of least resistance) than through body 330. In high field signals 340, the resistance of body 330 decreases so that more current flows through body 330 than through shunt 332.

Figure 3C:
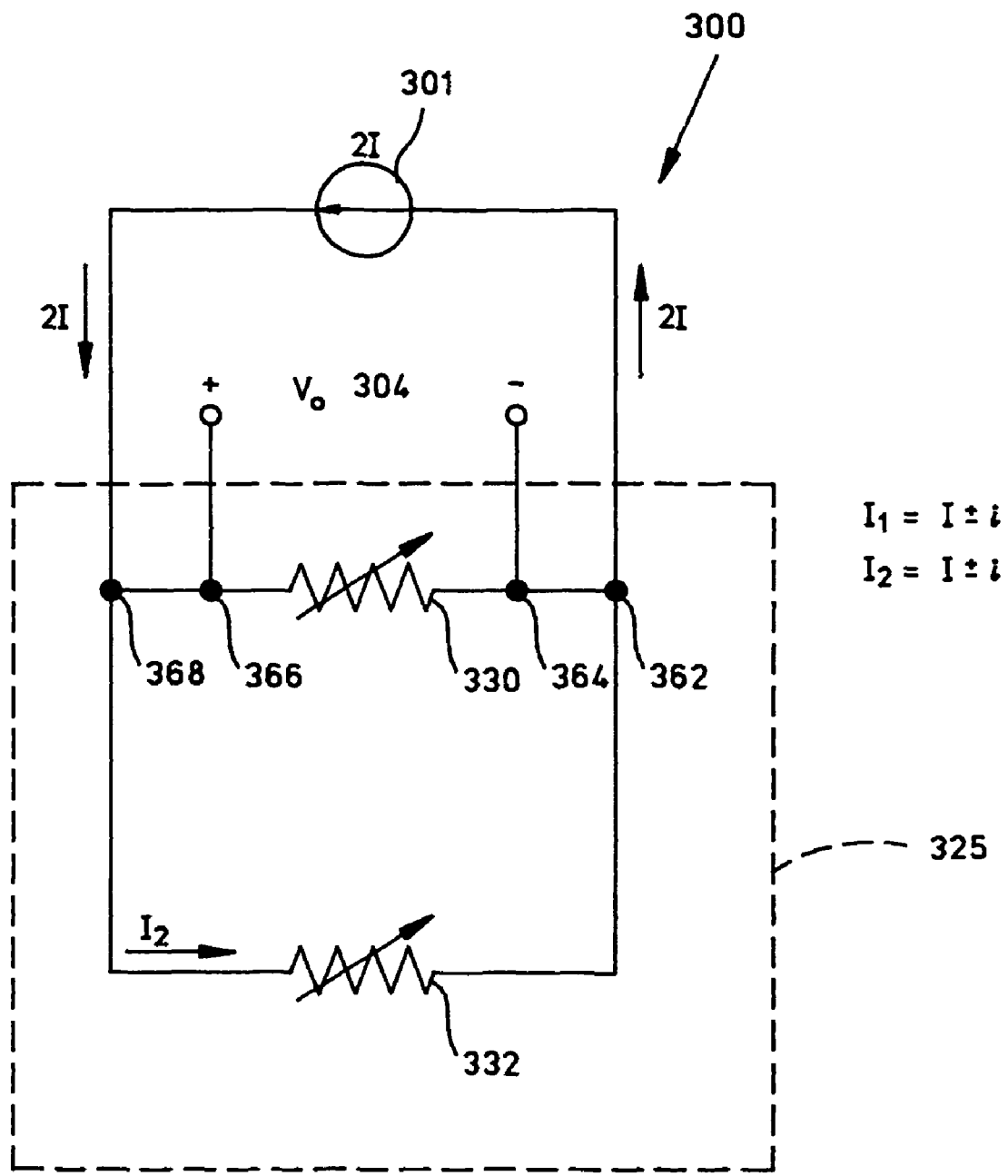
FIG. 3C is a schematic diagram of an electrical circuit used in the EMR magnetic head.

In FIG. 3C, an electrical schematic representation 300 of EMR magnetic head 325 with additional processing circuitry of the present application is shown. Note that schematic representation 300 is a simplified example utilized to illustrate general operation. Although EMR magnetic head 325 is provided on slider 320 of the disk drive, some or all of the remaining components may be included within arms electronics (AE) of the disk drive separate and apart from the slider.

Schematic representation 300 of FIG. 3C includes a fixed current source 301, body 330 which is represented by a variable resistor, and shunt 332 which is represented by a fixed resistor. Fixed current source 301, the variable resistor of body 330, and the fixed resistor of shunt 332 are coupled in parallel with each other. Current contacts 368 and 362 and voltage contacts 366 and 364 are also identified in FIG. 3C as shown. A voltage output 304 is provided across the variable resistor of body 330 at voltage contacts 366 and 364. During operation, fixed current source 301 provides a fixed current 2I to EMR magnetic head 325. With low field signals, the resistance of body 330 increases such that a current $I_1=I-i$ flows through body 330 and a current $I_2=I+i$ is shunted through current shunt 332. With high field signals, the resistance of body 330 decreases such that the current $I_1=I+i$ flows through body 330 and current $I_2=I-i$ is shunted through shunt 332. A detected voltage at voltage output 304 varies in response to the changing current through body 330.

The configuration and placement of flux guide structures 370 and 372 may be varied in order to increase a read resolution of EMR magnetic head 325. As shown in FIGS. 3A and 3B, flux guide 370 extends below body 330 and shunt 332 to sensing plane 382 over a distance $D_R$. This distance $D_R$ is a recess distance (where the body and the shunt are recessed from sensing plane 382) and may range from 0 nm to 50 nm. This distance helps protect EMR magnetic head 325 from possible damage.

Advantageously, the magnetic flux guide orients magnetic field signal 340 of recorded bit 317 on track 318 from magnetic disk 316 in a substantially normal direction to field receiving surface 350 of EMR magnetic head 325. Also, flux guide structure 370 at least partially shields field receiving surface 350 of body 330 magnetically, and allows for positioning of EMR magnetic head 325 on tail end 380 of slider 320. The coupling of flux guide structure 372 with second end 392 of body 330 completes a low energy path for magnetic field signal 340 thereby resulting in increased overall efficiency of EMR magnetic head 325. Furthermore, the configurations of EMR magnetic head 325 on tail end 380 of slider 320 allow easily for a write head to be fabricated on the slider. Finally, body 330 is created with a very narrow active region and does not require magnetic materials utilized in conventional sensors and therefore does not suffer from magnetic noise associated therewith. Preferably, the slider over which the body is formed is made from a material of similar crystal structure, but higher electrical resistance, as the material of the body. In this way, the body may be grown epitaxially from the slider and be integrally formed therewith.

Final Comments. As described herein, a magnetic head of the present application has a sensor which employs the extraordinary magnetoresistance (EMR) effect. The magnetic head includes a body of semiconductor material positioned over a tail end of a carrying mechanism; a field receiving surface of the body oriented perpendicular to a sensing plane of the magnetic head; an electrically conducting shunt coupled to a first end of the body; a plurality of electrically conducting contacts coupled to a second end of the body opposite the first end; and a magnetic flux guide having a first end at least partially formed over the field receiving surface and a second end exposed at the sensing plane. Advantageously, the magnetic flux guide orients a signal field of recorded data from a magnetic medium in a suitable direction for the field receiving surface, at least partially shields the field receiving surface magnetically, and allows for positioning of the magnetic head on the tail end of the carrying mechanism. The slider over which the body is formed is made from a material of similar crystal structure, but higher electrical resistance, as the material of the body. In this way, the body may be grown epitaxially from the slider and be integrally formed therewith.

A disk drive of the present application includes a housing; a magnetic disk rotatably supported in the housing; a magnetic head; a carrying mechanism mounted in the housing for supporting the magnetic head so as to be in a transducing relationship with the magnetic disk at a sensing plane; a spindle motor for rotating the magnetic disk; an actuator connected to the support for moving the magnetic head to multiple positions with respect to said magnetic disk; a processor connected to the magnetic head, to the spindle motor, and to the actuator for exchanging signals with the magnetic head for controlling movement of the magnetic disk and for controlling the position of the magnetic head; the magnetic head including a body of semiconductor material positioned over a tail end of a carrying mechanism; a field receiving surface of the body oriented perpendicular to a sensing plane of the magnetic head; an electrically conducting shunt coupled to a first end of the body; a plurality of electrically conducting contacts coupled to a second end of the body opposite the first end; and a magnetic flux guide having a first end at least partially formed over the field receiving surface and a second end exposed at the sensing plane.

It is to be understood that the above is merely a description of preferred embodiments of the invention and that various changes, alterations, and variations may be made without departing from the true spirit and scope of the invention as set for in the appended claims. Few if any of the terms or phrases in the specification and claims have been given any special particular meaning different from the plain language meaning to those ordinarily skilled in the art, and therefore the specification is not to be used to define terms in an unduly narrow sense.

What is claimed is:

1. A magnetic head, comprising:
   a body of semiconductor material having a rear surface positioned on a tail end of a carrying mechanism;
   a field receiving surface of the body oriented perpendicular to a sensing plane of the magnetic head and opposite the rear surface of the body;
   an electrically conducting shunt coupled to a first end of the body;
   a plurality of electrically conducting contacts coupled to a second end of the body opposite the first end;
   a first magnetic flux guide having a first end at least partially formed over the field receiving surface and a second end exposed at the sensing plane;
   a second magnetic flux guide positioned on the tail end of the carrying mechanism and coupled to the second end of the body; and
   the second magnetic flux guide situated further away from the sensing plane than the first magnetic flux guide.

2. The magnetic head of claim 1, wherein the magnetic head comprises an extraordinary magnetoresistance magnetic head.

3. The magnetic head of claim 1, wherein the body and the shunt are recessed from the sensing plane.

4. The magnetic head of claim 1, further comprising:
   wherein the carrying mechanism is made with a material of similar crystal structure, but electrical higher resistance, as the material of the body; and
   wherein the body is integrally formed with the carrying mechanism.

5. The magnetic head of claim 1, wherein the sensing plane comprises an air bearing surface (ABS).

6. The magnetic head of claim 1, wherein the carrying mechanism comprises a slider.

7. The magnetic head of claim 1, wherein the first magnetic flux guide at least partially shields the field receiving surface magnetically.

8. The magnetic head of claim 1, wherein the first magnetic flux guide provides the field receiving surface with magnetic field signals substantially normal thereto from magnetic recording media at the sensing plane.

9. A disk drive, comprising:
   a housing;
   a magnetic disk rotatably supported in the housing;
   a magnetic head;
   a carrying mechanism mounted in the housing for supporting the magnetic head so as to be in a transducing relationship with the magnetic disk at a sensing plane;
   a spindle motor for rotating the magnetic disk;
   an actuator connected to the carrying mechanism for moving the magnetic head to multiple positions with respect to said magnetic disk;
   a processor connected to the magnetic head, to the spindle motor, and to the actuator for exchanging signals with the magnetic head for controlling movement of the magnetic disk and for controlling the position of the magnetic head;
   the magnetic head, comprising:
      a body of semiconductor material having a rear surface positioned on a tail end of the carrying mechanism;
      a field receiving surface of the body oriented perpendicular to a sensing plane of the magnetic head and opposite the rear surface of the body;
      an electrically conducting shunt coupled to a first end of the body;
      a plurality of electrically conducting contacts coupled to a second end of the body opposite the first end;
      a first magnetic flux guide having a first end at least partially formed over the field receiving surface and a second end exposed at the sensing plane;
      a second magnetic flux guide positioned on the tail end of the carrying mechanism and coupled to the second end of the body; and
      the second magnetic flux guide situated further away from the sensing plane than the first magnetic flux guide.

10. The disk drive of claim 9, wherein the magnetic head comprises an extraordinary magnetoresistance magnetic head.

11. The disk drive of claim 9, wherein the body and the shunt are recessed from the sensing plane.

12. The disk drive of claim 9, wherein the shunt comprises gold (Au).

13. The disk drive of claim 9, wherein the sensing plane comprises an air bearing surface.

14. The disk drive of claim 9, further comprising:
    wherein the carrying mechanism comprises a slider;
    wherein the slider is made with a material of similar crystal structure, but higher electrical resistance, as the material of the body; and
    wherein the body is integrally formed with the carrying mechanism.

15. The disk drive of claim 9, wherein the first magnetic flux guide at least partially shields the field receiving surface magnetically.

16. The disk drive of claim 10, wherein the first magnetic flux guide provides the field receiving surface with magnetic field signals substantially normal thereto from magnetic recording media at the sensing plane.

17. An extraordinary magnetoresistive (EMR) head, comprising:
    a body of semiconductor material having a rear surface positioned on a tail end of a carrying end and being integrally formed with and grown epitaxially from the tail end of the carrying mechanism;

a field receiving surface of the body oriented perpendicular to an air bearing surface (ABS) of the magnetic head and opposite the rear surface of the body;

an electrically conducting shunt coupled to a first end of the body;

a plurality of electrically conducting contacts coupled to a second end of the body opposite the first end;

a first magnetic flux guide having a first end at least partially formed over the field receiving surface and a second end exposed at the ABS;

the first magnetic flux guide being adapted to provide the field receiving surface with magnetic field signals substantially normal thereto from magnetic recording media at the ABS;

a second magnetic flux guide positioned on the tail end of the carrying mechanism and coupled to the second end of the body; and the second magnetic flux situated further away from the sending plane than the first magnetic flux guide.

18. The extraordinary magnetoresistive head of claim 17, wherein the slider is made with a material of similar crystal structure, but electrical higher resistance, as the material of the body.

19. The extraordinary magnetoresistive head of claim 17, wherein the body and the shunt are recessed from the ABS.

20. The extraordinary magnetoresistive head of claim 17, wherein the first magnetic flux guide at least partially shields the field receiving surface magnetically.

* * * * *